US012631404B2

(12) United States Patent
Yang et al.

(10) Patent No.: US 12,631,404 B2
(45) Date of Patent: May 19, 2026

(54) PRINTED CIRCUIT-TYPE HEAT EXCHANGER HAVING INTEGRAL STRUCTURE

(71) Applicant: DOOSAN ENERBILITY CO., LTD., Changwon (KR)

(72) Inventors: Ki Hoon Yang, Yongin-si (KR); Jeong Kil Kim, Busan (KR); Chil Yeong Seon, Yongin-si (KR); In Chul Jung, Changwon-si (KR)

(73) Assignee: DOOSAN ENERBILITY CO., LTD, Changwon (KR)

( * ) Notice: Subject to any disclaimer, the term of this patent is extended or adjusted under 35 U.S.C. 154(b) by 0 days.

(21) Appl. No.: 16/168,749

(22) Filed: Oct. 23, 2018

(65) Prior Publication Data

US 2019/0137197 A1     May 9, 2019

(30) Foreign Application Priority Data

Nov. 3, 2017    (KR) ........................ 10-2017-0145883
Dec. 14, 2017    (KR) ........................ 10/2017/0172087

(51) Int. Cl.
*F28F 3/04*          (2006.01)
*F28D 9/00*          (2006.01)
            (Continued)

(52) U.S. Cl.
CPC ............ *F28F 3/048* (2013.01); *F28D 9/0037* (2013.01); *F28F 3/086* (2013.01); *F28F 9/0221* (2013.01);
            (Continued)

(58) Field of Classification Search
CPC ........ F28F 3/048; F28F 2210/10; F28F 3/005; F28F 3/086; F28F 13/06; F28F 2250/102;
            (Continued)

(56) References Cited

U.S. PATENT DOCUMENTS 4,170,220 A * 10/1979 Smith ..................... F24S 90/10
                                                    126/628
4,282,927 A *  8/1981 Simmons ................ F28F 3/027
                                                    165/166
(Continued)

FOREIGN PATENT DOCUMENTS

CN        1158499 C      7/2004
CN       101738125 A     6/2010
            (Continued)

OTHER PUBLICATIONS

WO-03054468-A1—English machine translation (Year: 2003).*
            (Continued)

*Primary Examiner* — Joel M Attey
*Assistant Examiner* — For K Ling
(74) *Attorney, Agent, or Firm* — Harvest IP Law, LLP

(57)          ABSTRACT

A heat exchanger includes a stack of channel plates including first and second channel plates alternately stacked on one another such that fluids A and B are heat-exchanged each other. The first channel plate has a fluid path for fluid A on one surface thereof, wherein inflow and outflow parts for fluid A are formed on the fluid path for fluid A, and the second channel plate has a fluid path for fluid B intersecting with the fluid path for fluid A on one surface thereof. The first channel plate has communicating structures corresponding to the inflow and outflow parts for fluid B. The heat exchanger also includes an upper plate section attached to an upper surface of the stack, and a lower plate section attached to an undersurface of the stack.

13 Claims, 15 Drawing Sheets

(51) Int. Cl.

| | |
|---|---|
| *F28F 3/08* | (2006.01) |
| *F28F 9/02* | (2006.01) |
| *H05K 1/02* | (2006.01) |
| *F28D 21/00* | (2006.01) |

(52) U.S. Cl.
CPC ........... *H05K 1/0201* (2013.01); *F28D 9/005* (2013.01); *F28D 9/0056* (2013.01); *F28D 9/0068* (2013.01); *F28D 9/0075* (2013.01); *F28D 2021/0033* (2013.01); *F28F 2210/10* (2013.01); *F28F 2275/06* (2013.01)

(58) Field of Classification Search
CPC .... F28D 9/0037; F28D 9/0075; F28D 9/0068; F28D 9/0056; F28D 9/02; F28D 2021/0033; F28D 9/005
USPC ................................................. 165/165–167
See application file for complete search history.

(56) References Cited

U.S. PATENT DOCUMENTS

| | | | | |
|---|---|---|---|---|
| 4,516,632 | A * | 5/1985 | Swift | F28D 9/0075 165/166 |
| 4,523,638 | A * | 6/1985 | Rosman | F28D 9/0018 165/167 |
| 5,392,849 | A * | 2/1995 | Matsunaga | F28D 9/0075 165/167 |
| 6,230,408 | B1 | 5/2001 | Mikrotechnik | |
| 6,251,534 | B1 * | 6/2001 | McElroy | H01M 8/04089 429/444 |
| 6,309,773 | B1 * | 10/2001 | Rock | H01M 8/0263 429/443 |
| 6,420,061 | B1 * | 7/2002 | Fujii | H01M 8/0263 429/452 |
| 6,510,894 | B1 * | 1/2003 | Watton | B01J 19/0013 165/166 |
| 6,528,196 | B1 * | 3/2003 | Fujii | H01M 8/0258 429/468 |
| 6,695,044 | B1 * | 2/2004 | Symonds | B01J 19/249 165/166 |
| 6,959,492 | B1 * | 11/2005 | Matsumoto | F28D 9/0075 29/890.039 |
| 6,968,892 | B1 * | 11/2005 | Symonds | F28D 9/0075 165/165 |
| 8,986,905 | B2 * | 3/2015 | McElroy | H01M 8/0258 429/514 |
| 2005/0019646 | A1 * | 1/2005 | Joos | H01M 8/0297 429/434 |
| 2005/0260472 | A1 * | 11/2005 | Rapaport | F28D 9/005 429/514 |
| 2010/0282452 | A1 * | 11/2010 | Diem | F01K 25/10 165/167 |
| 2013/0126137 | A1 * | 5/2013 | Velte | F28F 3/086 165/167 |
| 2014/0026577 | A1 * | 1/2014 | Reinke | F01K 13/006 60/670 |
| 2014/0216702 | A1 * | 8/2014 | Vallee | F28F 3/044 165/168 |
| 2016/0131434 | A1 * | 5/2016 | Noishiki | F28D 9/0037 165/296 |
| 2016/0178077 | A1 * | 6/2016 | Matsuoka | H01L 23/473 137/154 |
| 2016/0359211 | A1 * | 12/2016 | Kenney | F28F 3/044 |
| 2017/0328644 | A1 * | 11/2017 | Takahashi | F28F 9/22 |
| 2018/0164051 | A1 * | 6/2018 | Noishiki | B01F 33/30 |

FOREIGN PATENT DOCUMENTS

| | | | | | |
|---|---|---|---|---|---|
| CN | 102575912 | A | 7/2012 | | |
| CN | 104990434 | A | 10/2015 | | |
| EP | 2474803 | A | 7/2012 | | |
| JP | H03251687 | A | 11/1991 | | |
| JP | H06265284 | A | 9/1994 | | |
| JP | 2002318089 | A | 10/2002 | | |
| JP | 2004-28538 | A | 1/2004 | | |
| JP | 2014-152963 | A | 8/2014 | | |
| JP | 2014-521913 | A | 8/2014 | | |
| JP | 2015031420 | A | 2/2015 | | |
| JP | 6056928 | A | 1/2017 | | |
| KR | 10-2007-0118559 | A | 12/2007 | | |
| KR | 10-2012-0086921 | A | 8/2012 | | |
| WO | 9966280 | A | 12/1999 | | |
| WO | WO-03054468 | A1 * | 7/2003 | .......... | F28D 9/0043 |
| WO | 2013114474 | A | 8/2013 | | |
| WO | WO-2016072100 | A1 * | 5/2016 | ............... | F28F 9/22 |

OTHER PUBLICATIONS

Japanese Office Action.
10-2017-0145883 Korean Office Action.
10-2017-0172087 Korean Office Action.
IP 1894571—Mar. 20, 2020 Office Action.

* cited by examiner

Enlarged view of Section "A"

Line of
Symmetry

112

111

PRINTED CIRCUIT-TYPE HEAT EXCHANGER HAVING INTEGRAL STRUCTURE

CROSS REFERENCE TO RELATED APPLICATION

The present application claims priority to Korean Patent Application Nos. 10-2017-0145883, filed on Nov. 3, 2017, and 10-2017-0172087, filed on Dec. 14, 2017, the entire contents of which are incorporated herein for all purposes in their entirety by this reference.

BACKGROUND

1. Field

The system relates to a printed circuit-type heat exchanger and, more particularly, to a printed circuit-type heat exchanger having a structure without dead space.

2. Description of the Background Art

A conventional shell-tube type heat exchanger has problems in that since it is disadvantageous in terms of a heat transfer area per unit volume, it needs to have a housing with sufficient size to accommodate possible thermal expansion, and a heavy and bulky installation is required for processing of heat transfer capacity over a certain level.

In case of a heat exchanger used in an LNG ship, particularly, it is preferred that the heat exchanger have a small volume, as well as having heat exchange capacity over a certain level.

Further, the conventional shell-tube type heat exchanger has problems in that maintenance and repair are not easy to perform, and a scale of a carrying crane, handling apparatus, etc. should be increased.

To solve these problems, a printed circuit-type heat exchanger (PCHE) has been proposed and utilized.

FIG. 1 is a partially-cut perspective view of a conventional printed circuit-type heat exchanger (PCHE), and FIG. 2 is a perspective view of the PCHE shown in FIG. 1.

Further, FIG. 3 is an exploded perspective view of the PCHE shown in FIG. 2, and FIG. 4 is a perspective view of the PCHE shown in FIG. 3, wherein a header, upper and lower header plates, an inflow tube, an outflow tube, and upper and lower plates of the heat exchanger are separately illustrated.

When the PCHE is applied to a high pressure system, a thickness of a header is required to increase, so a design of built-in type header is advantageous.

When such a built-in type header is applied, distances between headers and between outer walls thereof should have a predefined length or more according to allowable stress and system pressure.

To satisfy theses conditions, the conventional PCHE is formed by welding respective parts fabricated in specified shapes and sizes, as illustrated in FIGS. 3 and 4.

Specifically, in the conventional PCHE 10, inflow and outflow headers 13 and 14 for fluid B are formed by welding upper header plates 13-1, 14-1 and lower header plates 13-2, 14-2, which are separately fabricated, together.

This conventional PCHE has problems in that it takes much time to perform welding and check welds, because respective parts are separately fabricated.

Moreover, according to the conventional PCHE, since as illustrated in FIGS. 2 to 4, the inflow and outflow tubes 11 and 12 for fluid B are respectively welded onto curved sides of the heads 13 and 14, a skilled person is required to perform high quality welding.

Thus, in fabricating this type PCHE, there are problems in that skilled persons are required, much working time is taken, and thus manufacturing cost increases.

FIG. 5 is a plan view illustrating a channel structure of a channel plate in the printed circuit-type heat exchanger shown in FIG. 3.

In order to satisfy a design condition that when a built-in type header is applied, distances between headers and between outer walls thereof should have a predefined length or more according to allowable stress and system pressure, a conventional PCHE has a problem in that there is dead space S in which heat exchange does not occur, so heat exchange efficiency decreases.

If a planar area of the channel plate is increased to solve the above problems, heat exchange capacity increases, but a flow rate of fluid decreases, resulting in degradation of the heat exchange efficiency.

Furthermore, sine a distance between channels, which is applied to the printed circuit-type heat exchanger, is designed in conformity to a channel diameter, allowable stress, and system pressure, and the number of channels is determined according to diameters of headers, the number of channels has a limit.

However, if channel paths 17 are arranged in such a manner as to satisfy such conditions, as illustrated in FIG. 5, there may be dead spaces S through which the channel paths do not pass, so that heat exchange efficiency may be degraded.

As another solution to solve this problem, an arrangement in which printed circuit-type heat exchanger modules are connected in parallel with each other has been proposed. This arrangement, however, also has problems of heat loss and pressure loss through connection pipes.

Thus, it is required to provide a technique for a printed circuit-type heat exchanger to solve the above-mentioned problems with the related art.

SUMMARY

In an aspect of the system, a printed circuit-type heat exchanger is provided, which includes a structure allowing an simplified manufacturing process by simplifying the structure and having an improved heat exchange efficiency by eliminating a dead space in which heat exchange does not occur, the printed circuit-type heat exchanger including: a stack of channel plates having a structure in which two or more first channel plates each having a fluid path for fluid A and two or more second channel plates each having a fluid path for fluid B are alternately stacked on one another, such that fluids A and B are heat-exchanged between the first and second fluid paths; an inflow header for fluid A attached to a first side of the stack to supply fluid A to the first channel plates; an outflow header for fluid A attached to a second side of the stack, opposite to the first side, to supply the fluid A discharged from the first channel plates to the outside; an upper plate section attached to an upper surface of the stack to close the upper surface of the stack and upper surfaces of the inflow and outflow headers for fluid A; and a lower plate section attached to an undersurface of the stack to close the undersurface of the stack and undersurfaces of the inflow and outflow headers for fluid A.

In an embodiment, the fluid path for fluid A may have a planar structure in which a plurality of bent passages adjoins each other.

3

In an embodiment, the first and second channel plates may have a rectangular planar structure, and an inflow and outflow parts for fluid B formed on the second channel plate may have a semicircular or polygonal shape attached to opposite sides of the rectangular planar structure, with an internal space thereof communicating with the fluid path for fluid B.

The inflow and outflow parts for fluid B may be integrated with the second channel plate.

The first channel plate may be provided, on opposite sides thereof, with communicating structures corresponding to the inflow and outflow parts for fluid B.

The inflow and outflow parts for fluid and the communicating structures of the first channel plate may be stacked on one another to form a single communicating space.

The single communicating space may have a semi-cylindrical or polyprism structure.

In an embodiment, the stack of two or more first and second alternated channel plates may be provided, on one side thereof, with additional fluid holes communicating with the inflow and outflow parts for fluid B.

Inflow and outflow pipes for fluid B may be connected to the additional fluid holes.

In an embodiment, the first and second channel plates may have a rectangular planar structure, and an inflow and outflow parts for fluid A formed on the first channel plate may have a semicircular or polygonal shape attached to inner surfaces of the rectangular planar structure, with an internal space thereof communicating with the fluid path for fluid A.

The second channel plate may be provided with communicating structures corresponding to the inflow and outflow parts for fluid A.

The inflow and outflow parts for fluid A and the communicating structures of the second channel plate may be stacked on one another to form a single communicating space.

The single communicating space may have a semi-cylindrical or polyprism structure.

In an embodiment, the upper and lower plate sections may be integrally provided with planar sealing structures corresponding to the inflow and outflow parts for fluid B.

The planar sealing structures may have fluid holes through which the fluid B flows, and inflow and outflow pipes for fluid B may be connected to the fluid holes.

In an embodiment, the fluid path for fluid A of the first channel plate may have a planar structure in which a plurality of bent passages is arranged in a ' ≊ '-type, wherein the bent passages adjoin each other to form a horizontally symmetrical structure.

In an embodiment, the fluid path for fluid A may have inflow and outflow parts for fluid A on opposite end sides thereof, and may have a planar structure in which the fluid path divides into two fluid path branches in a symmetrical form from the inflow part for fluid A.

In an embodiment, the first channel plate may include three adjoining fluid paths for fluid A, having a median fluid path and opposite lateral fluid paths in a planar structure in which the opposite lateral fluid paths are symmetric with each other about the median fluid path for fluid A.

The fluid paths for fluid A may respectively have inflow and outflow parts for fluid A, wherein the median fluid path for fluid A has a planar structure in which the fluid path divides into two fluid path branches in a symmetrical manner from the inflow part for fluid A, and the opposite lateral fluid paths for fluid A are symmetric with each other about a median line of the first channel plate.

The lateral fluid paths for fluid A may extend in one direction from the inflow part for fluid A without divided branches.

DETAILED DESCRIPTION

Hereinafter, exemplary embodiments of the system will be described in detail with reference to the accompanying drawings. It should be noted that terms used in this specification and claims should not be limited to a common meaning or a dictionary definition, but should be construed as the meanings and concepts according to technical spirits of the system.

It will be understood that when an element is referred to as being "on" another element, it can be directly on the other element or intervening elements may be present therebetween. Further, it will be understood that the term, "comprising" or "including" specifies the presence of stated elements, but does not preclude the presence or addition of one or more other elements, unless the context clearly indicates otherwise.

Figure 1:
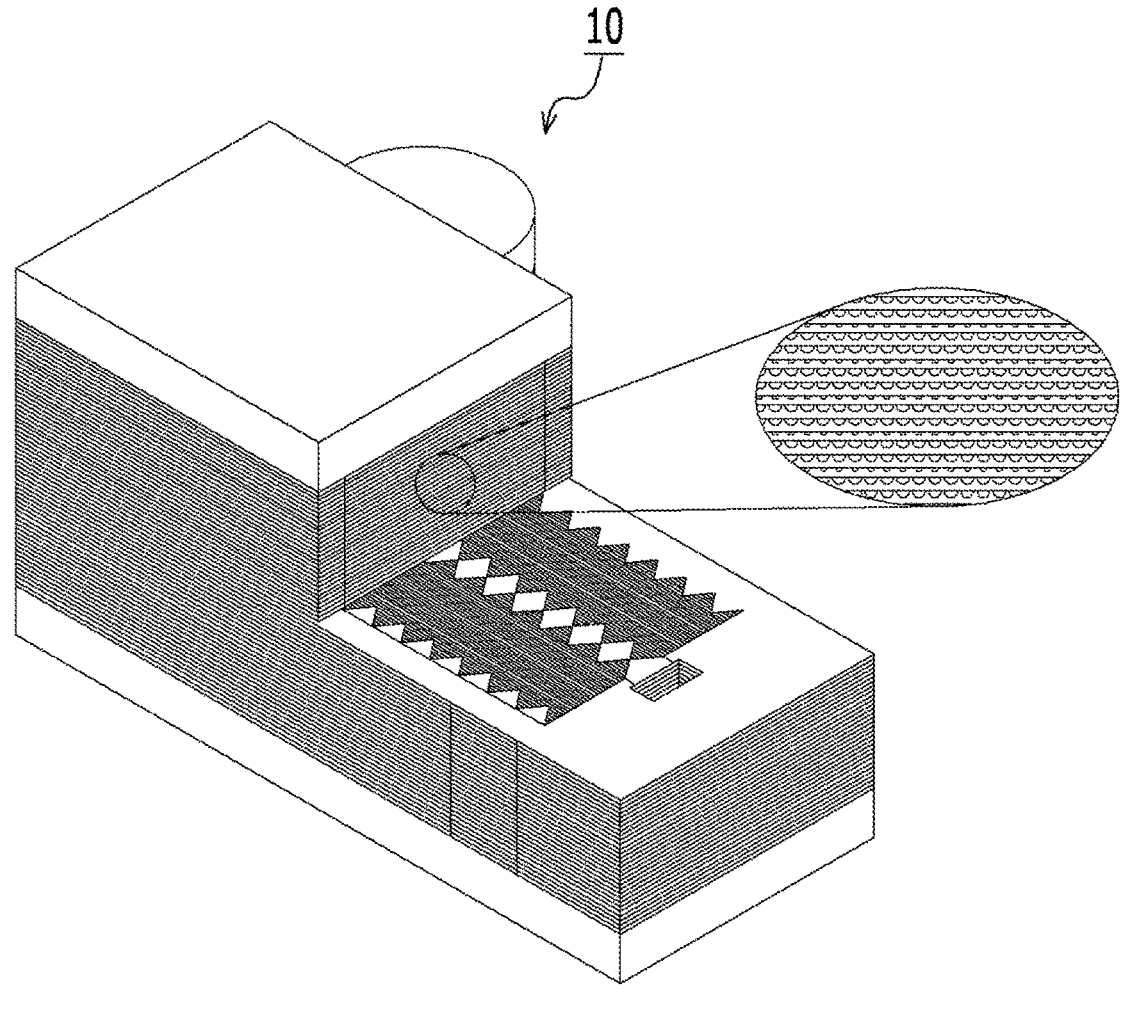
FIG. 1 is a partially-cut perspective view of a conventional printed circuit-type heat exchanger (PCHE)
Figure 2:
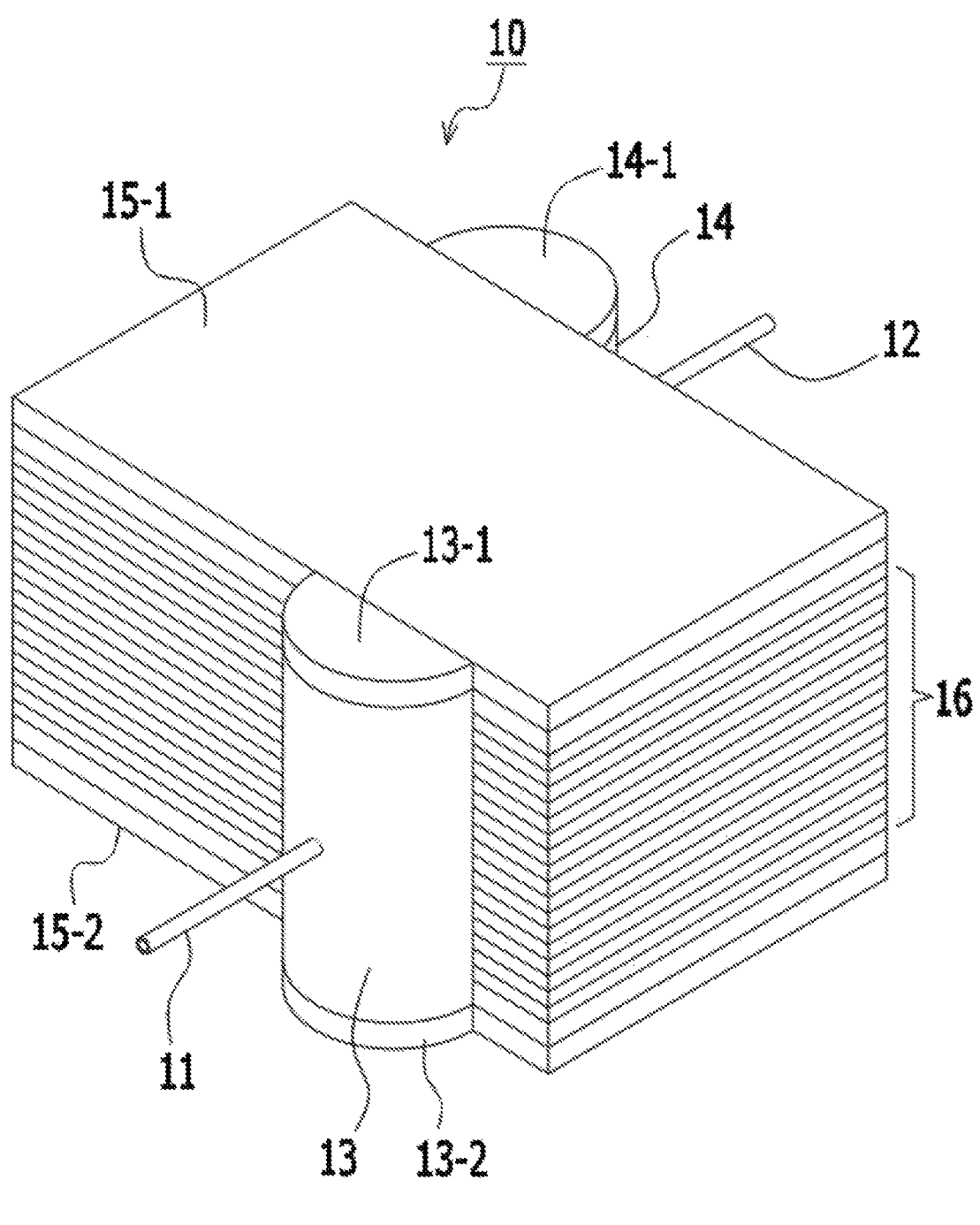
FIG. 2 is a perspective view of the PCHE shown in FIG. 1.
Figure 3:
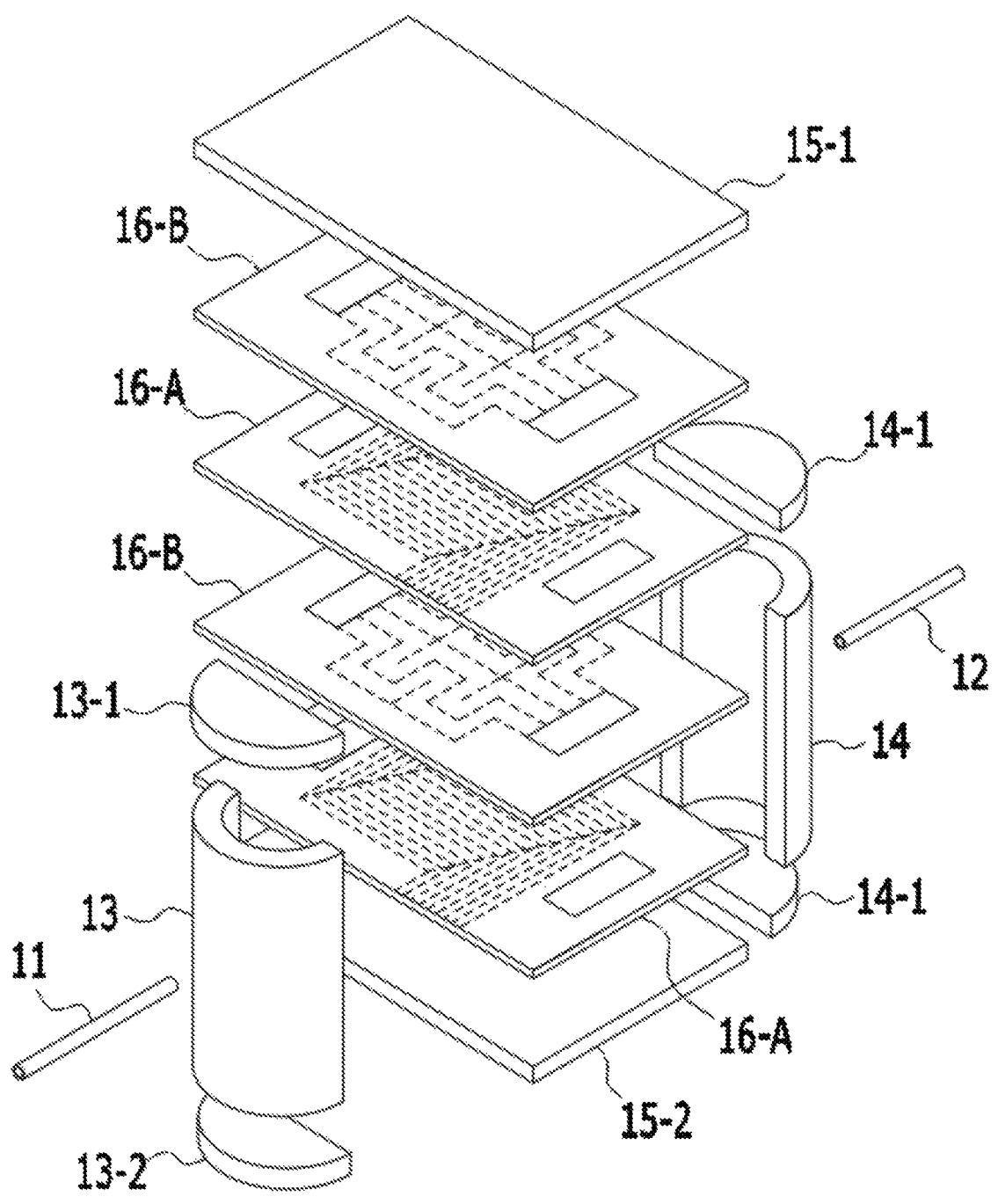
FIG. 3 is an exploded perspective view of the PCHE shown in FIG. 2.
Figure 4:
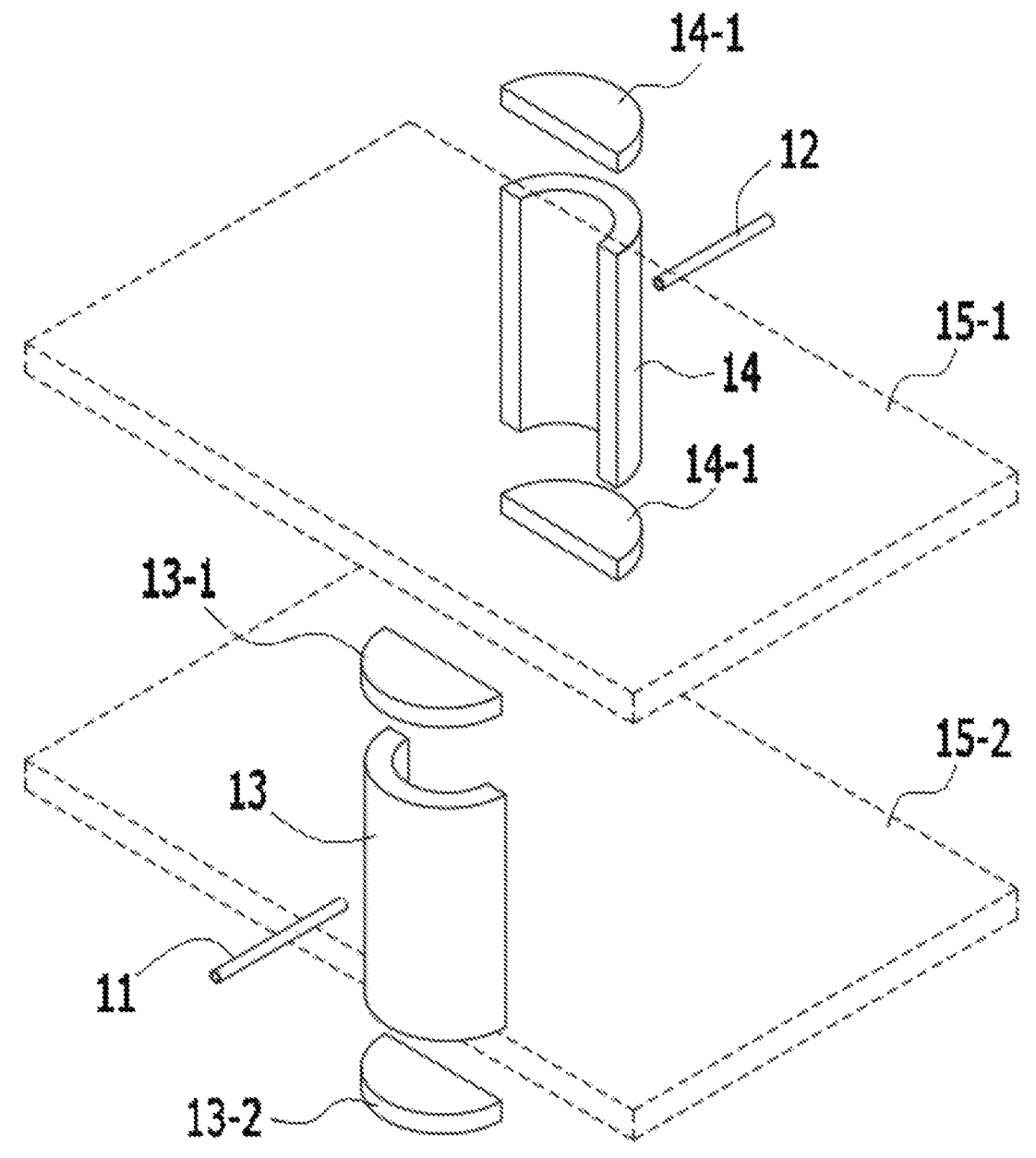
FIG. 4 is a perspective view of the PCHE shown in FIG. 3, wherein a header, upper and lower header plates, an inflow tube, an outflow tube, and upper and lower plates of the heat exchanger are separately illustrated.
Figure 5:
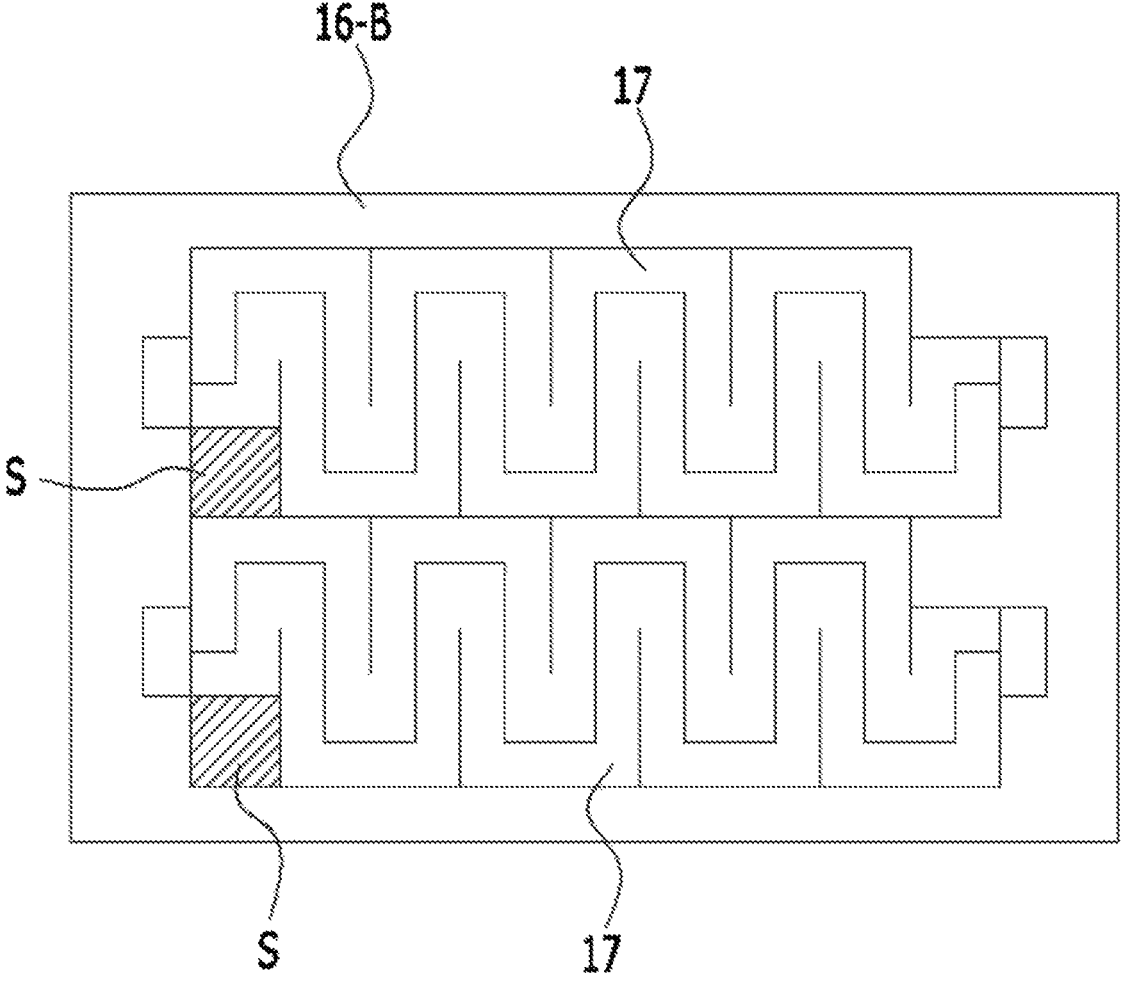
FIG. 5 is a plan view illustrating a channel structure of a channel plate in the printed circuit-type heat exchanger shown in FIG. 3.
Figure 6:
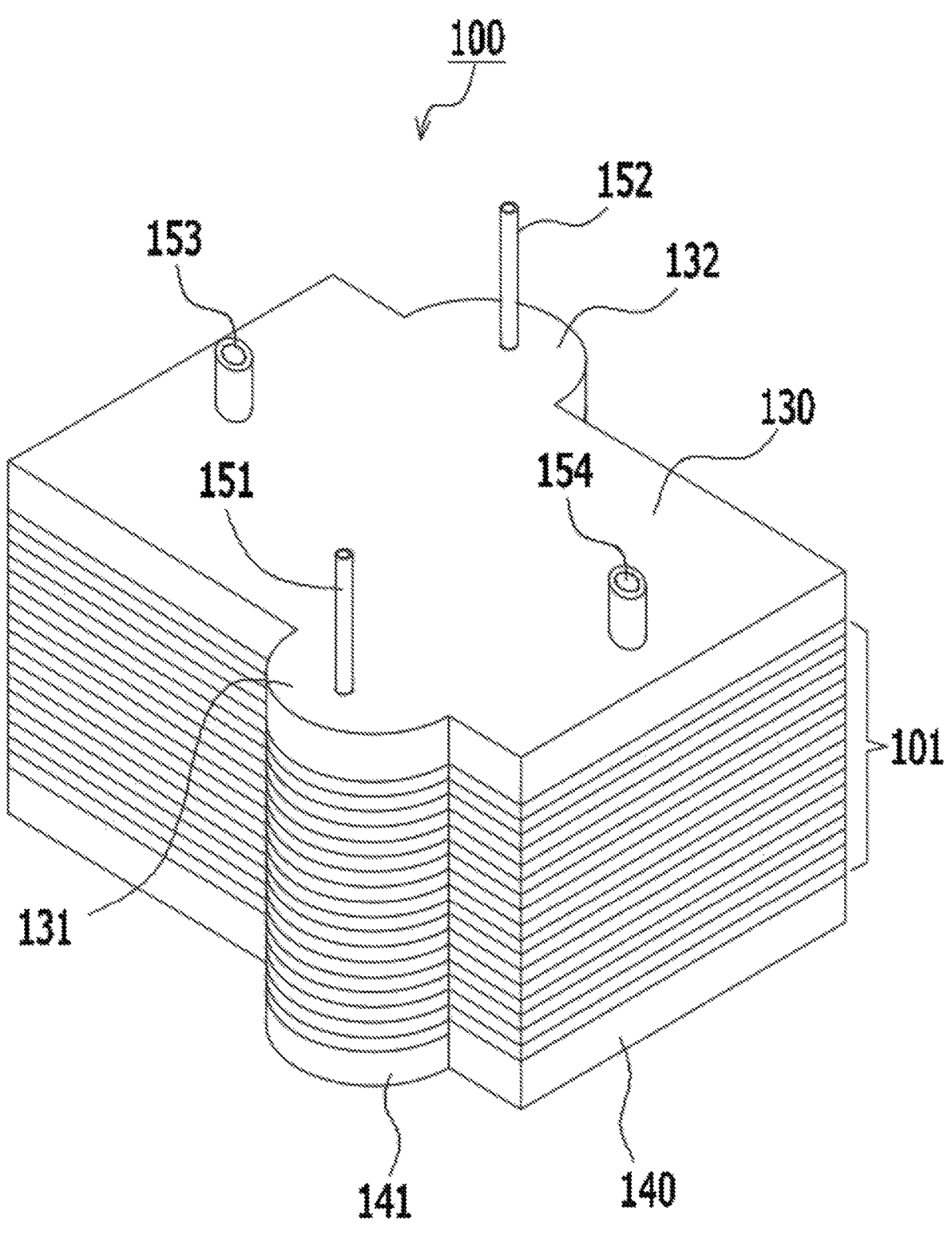
FIG. 6 is a perspective view of a printed circuit-type heat exchanger (PCHE) according to an embodiment of the system.
Figure 7:
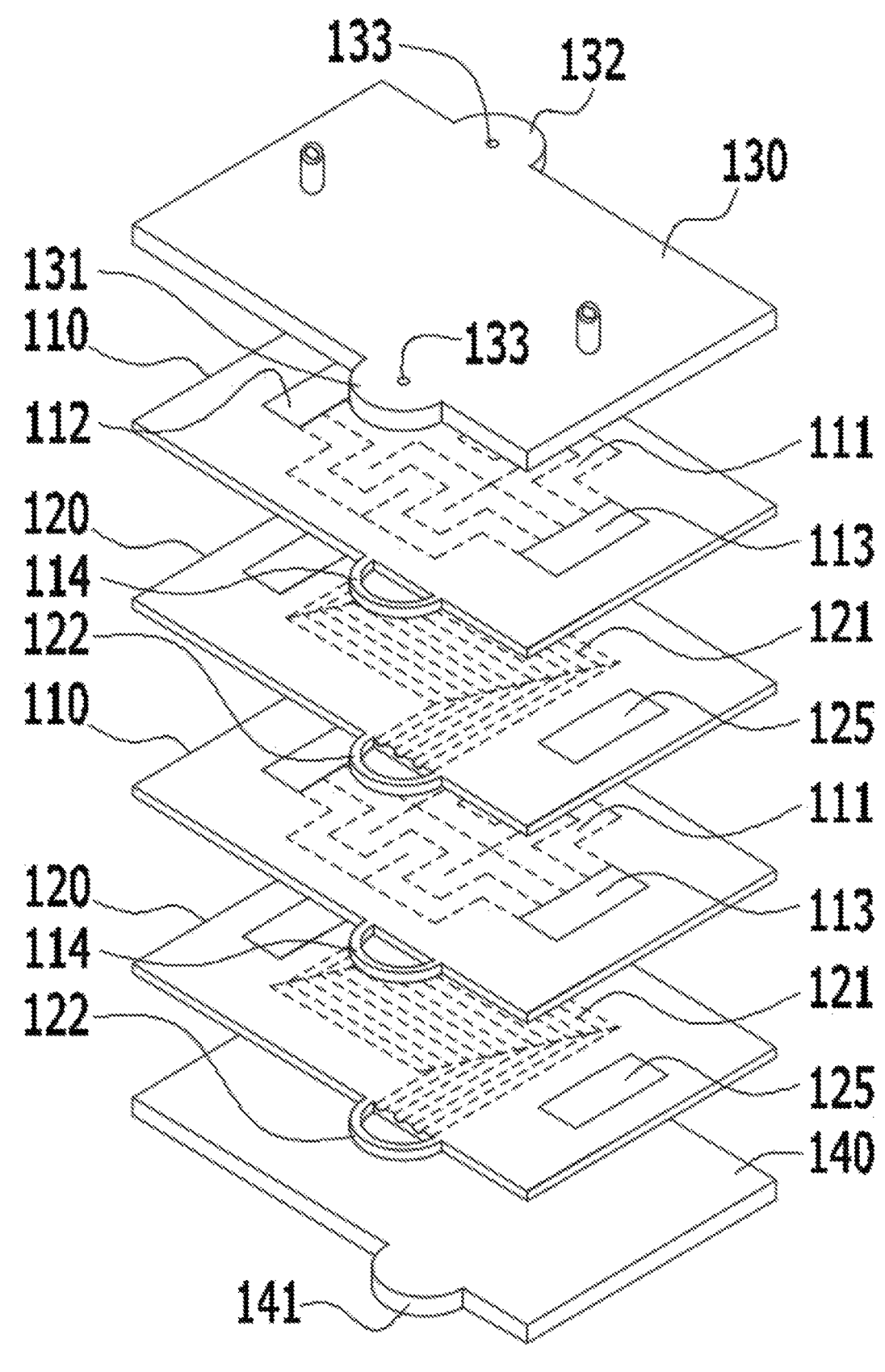
FIG. 7 is an exploded perspective view of the PCHE shown in FIG. 6 only illustrating an upper plate section, a stack of channel plates, and a lower plate section.

FIG. 6 is a perspective view of a printed circuit-type heat exchanger (PCHE) according to an embodiment of the system, and FIG. 7 is an exploded perspective view of the PCHE shown in FIG. 6, only illustrating an upper plate section, a stack of channel plates, and a lower plate section.

Referring to these drawings, the printed circuit-type heat exchanger (PCHE) has a simplified structure including a first channel plate 110, a second channel plate 120, an upper plate section 130, and a lower plate section 140, wherein the first and second channel plates have a fluid path for fluid A and a fluid path for fluid B, through which fluid A and fluid B are heat-exchanged, thereby simplifying a manufacturing process thereof.

Inflow and outflow tubes 153 and 154 for fluid A may be connected to the upper plate section 130 so as to communicate with inflow and outflow parts 112 and 113 for fluid A, respectively.

Hereinbelow, respective components of the PCHE 100 will be described in more detail.

In the PCHE 100 of the present embodiment, an inflow header, which needs to be separately fabricated, is omitted, and the inflow tube is attached to the upper or lower plate section, thereby facilitating the fabrication.

According to the related art, a side surface of a curved header needs to be machined to have a structure corresponding to one end side of inflow or outflow tube. Further, since the inflow or outflow tube has to be welded onto the machined part, a skilled person is required to perform high quality welding.

However, according to the present embodiment, since a target object is welded onto the upper or lower plate section 130 or 140 after being machined, a skilled person is not required, thereby having effects of a reduction in manufacturing time and cost.

Specifically, a conventional inflow header structure is integrated into the first and second channel plates 110 and 120.

Figure 9:
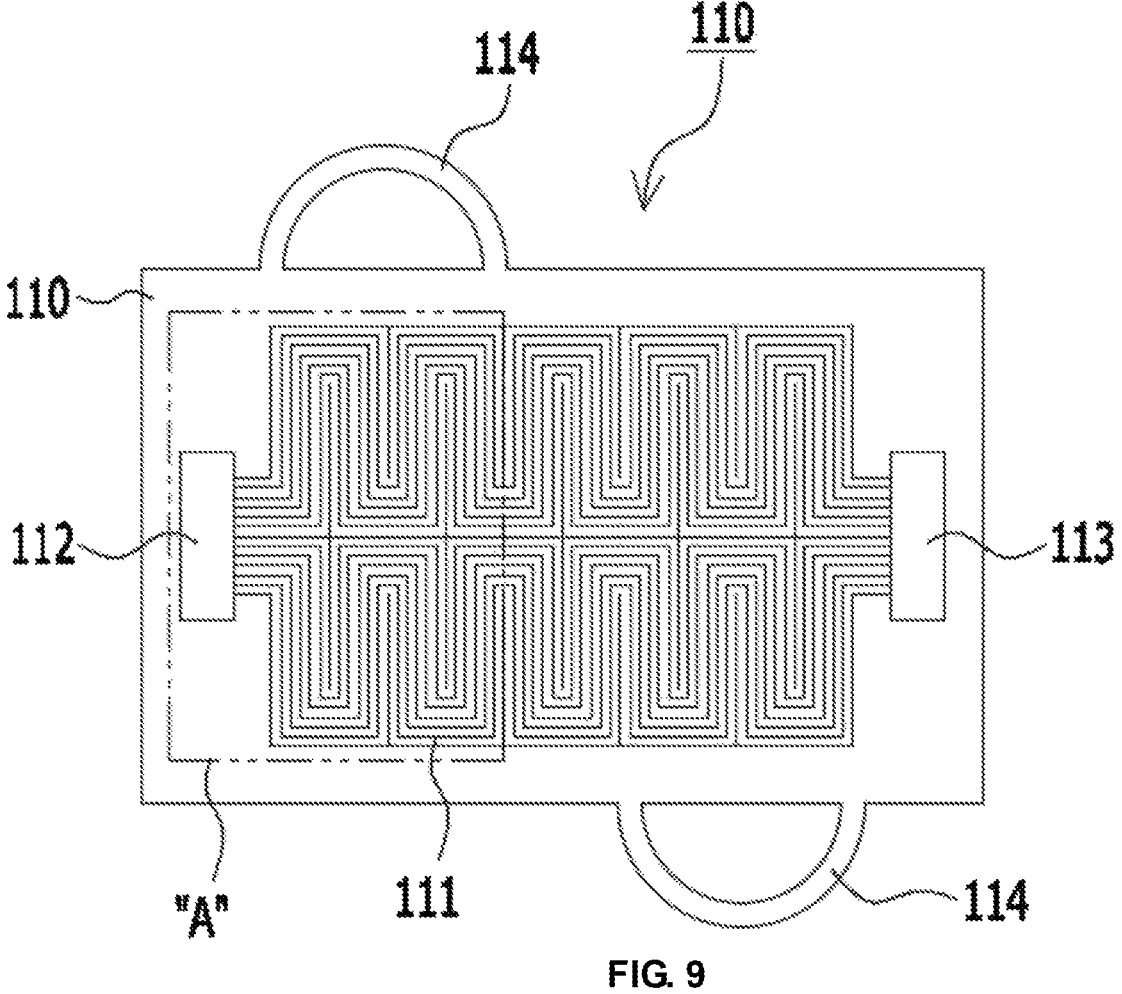
FIG. 9 is a plan view illustrating a first channel plate of the PCHE shown in FIG. 7.

More specifically, as illustrated in FIGS. 7 and 9, the first channel plate 110 has a planar structure in which a fluid path 111 for fluid A extends in two branches on one surface thereof, and inflow and outflow parts 112 and 113 for fluid A are provided on opposite end sides thereof, and communicating structures are provided corresponding to inflow and outflow parts 122 and 123 for fluid B. Here, as illustrated FIG. 9, the fluid path 111 for fluid A may have a planar structure in which a plurality of bent passages adjoins each other.

Further, the second channel plate 120 may have a planar structure in which a fluid path 121 for fluid B extends in two branches, intersecting with the fluid path 111 for fluid A, on one surface thereof, and inflow and outflow parts 122 and 123 for fluid B are integrally formed on opposite end sides of the fluid path 121 for fluid B.

Figure 10:
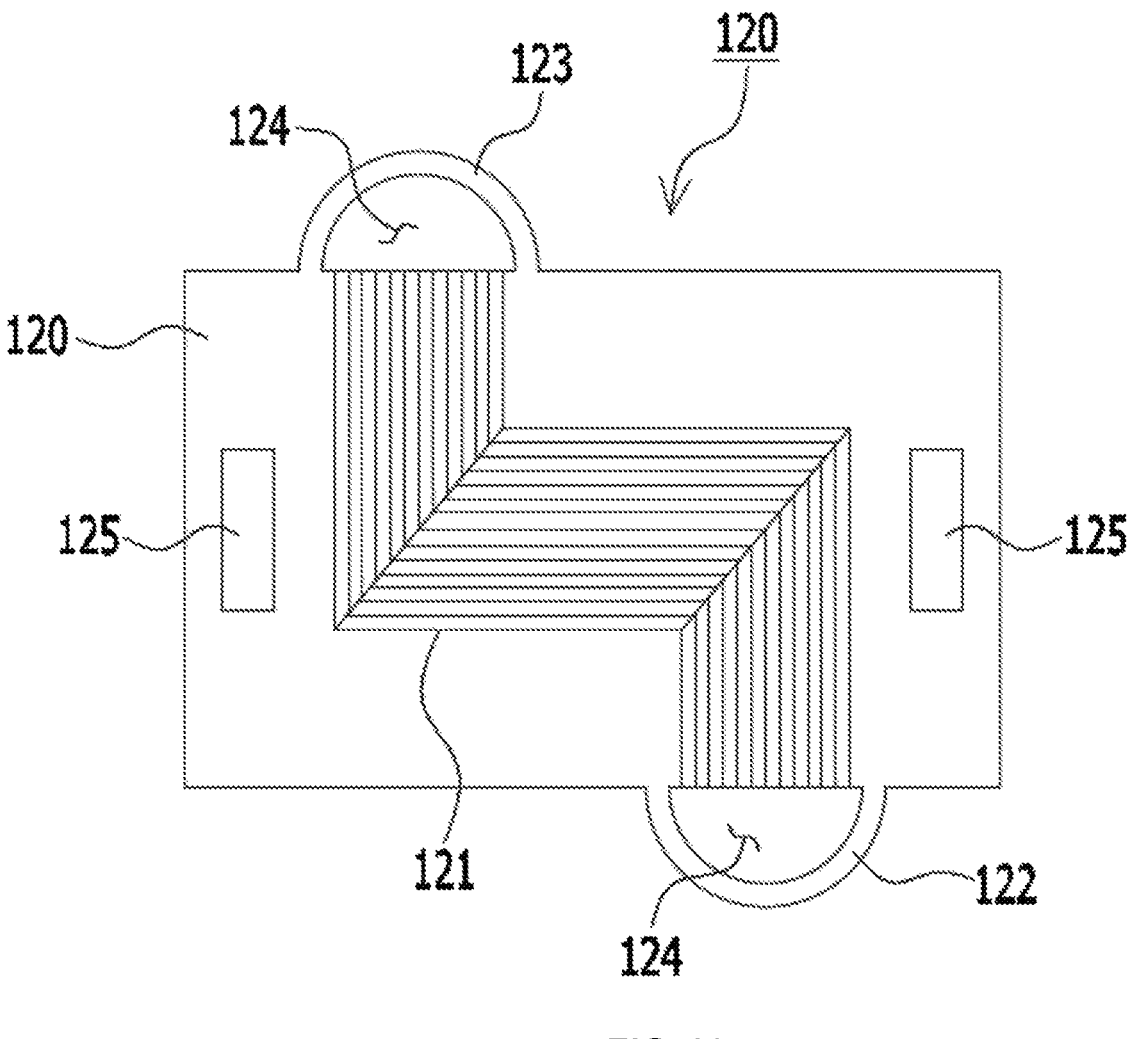
FIG. 10 is a plan view illustrating a second channel plate of the PCHE shown in FIG. 7.

More specifically, the first and second channel plates 110 and 120 may have a rectangular planar structure. Here, as illustrated in FIG. 10, the inflow and outflow parts 122 and 123 for fluid B formed on the second channel plate 120 may have a semicircular or polygonal shape attached to opposite sides of the rectangular planar structure, with an internal space 124 thereof communicating with the fluid path 121 for fluid B.

Figure 8:
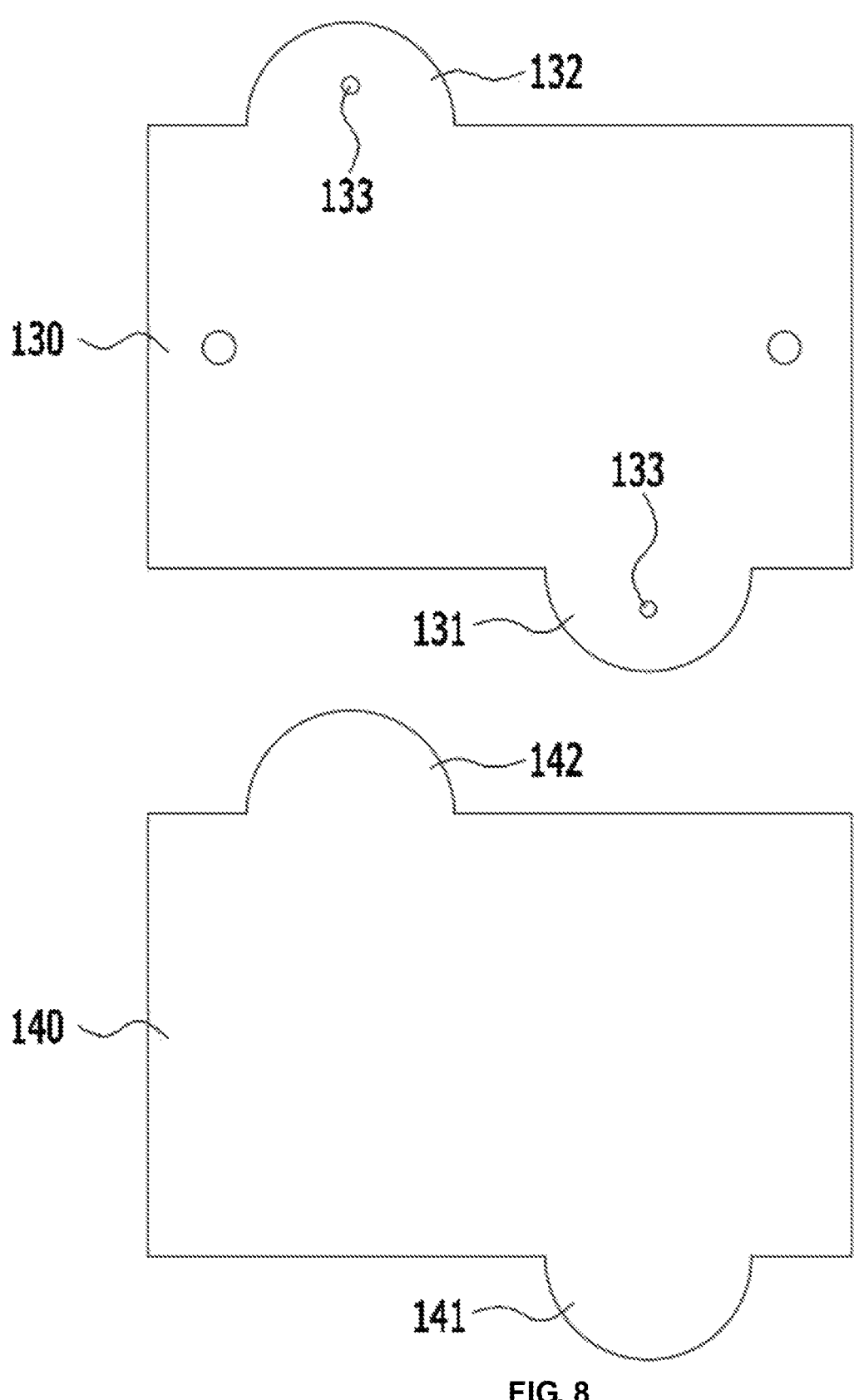
FIG. 8 is a plan view illustrating the upper and lower plate sections of the PCHE shown in FIG. 7.

The inflow and outflow parts 122 and 123 for fluid B may be integrated with the second channel plate 120, and as illustrated in FIG. 8, the first channel plate 110 may be provided, on opposite sides thereof, with communicating structures 114 corresponding to the inflow and outflow parts 122 and 123 for fluid B. In this case, the inflow and outflow parts 122 and 123 for fluid B and the communicating structures 114 of the first channel plate 110 may be stacked on one another to form a single communicating space. The single communicating space may have a semi-cylindrical or polyprism structure.

As illustrated in FIG. 9, an inflow and outflow parts 112 and 113 for fluid A formed on the first channel plate 110 may have a semicircular or polygonal shape attached to inner surfaces of the rectangular planar structure, with an internal space thereof communicating with the fluid path 111 for fluid A. Here, as illustrated in FIGS. 7 and 10, the second channel plate 120 may be provided with communicating structures 125 corresponding to the inflow and outflow parts 112 and 113 for fluid A. In this case, the inflow and outflow parts 112 and 113 for fluid A and the communicating structures 125 of the second channel plate 120 may be stacked on one another to form a single communicating space. Here, the single communicating space may have a semi-cylindrical or polyprism structure.

In the meantime, as illustrated in FIGS. 7 and 8, the upper plate section 130 may be attached to an upper surface of a stack 101 of two or more first and second channel plates 110 and 120 being alternately stacked so as to seal the upper surface of the stack 101 of channel plates.

Further, the lower plate section 140 may be attached to an undersurface of a stack 101 of two or more first and second channel plates 110 and 120 being alternately stacked so as to seal the undersurface of the stack 101 of channel plates.

Specifically, as illustrated in FIGS. 7 and 8, the upper and lower plate sections 130 and 140 may be integrally provided with planar sealing structures 131, 132, 141, and 142 corresponding to the inflow and outflow parts 122 and 123 for fluid B.

Here, the planar sealing structures 131 and 132 may have fluid holes 133 through which the fluid B flows, and inflow and outflow pipes 151 and 152 for fluid B may be connected to the fluid holes 133.

Figure 11:
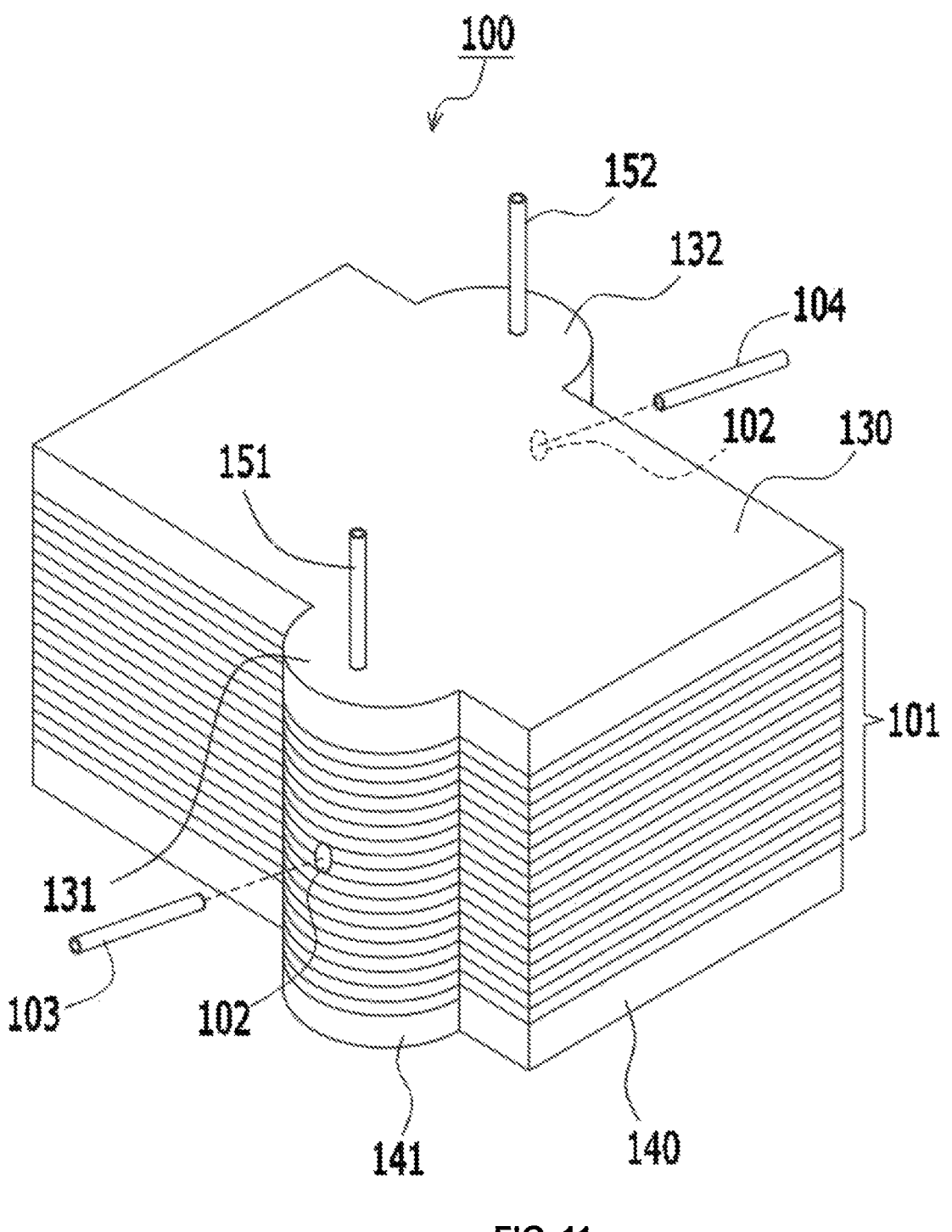
FIG. 11 is a perspective view of a printed circuit-type heat exchanger according to another embodiment of the system.

If needed, as illustrated in FIG. 11, the stack 101 of two or more first and second alternated channel plates 110 and 120 may be provided, on one side thereof, with additional fluid holes 102 communicating with the inflow and outflow parts 122 and 123 for fluid B. Here, inflow and outflow pipes 103 and 104 for fluid B may be connected to the additional fluid holes 102.

In this case, a flow rate of fluid B may be properly regulated by changing positions, extension length, inner diameters, etc. of the additional inflow and outflow pipes 103 and 104.

According to the configuration of the system, the provision of a heat exchanger housing, the stack of channel plates, and upper and lower plate sections, which have specified structures, is provided, thereby simplifying the arrangement and manufacturing process of the heat exchanger.

Figure 12:
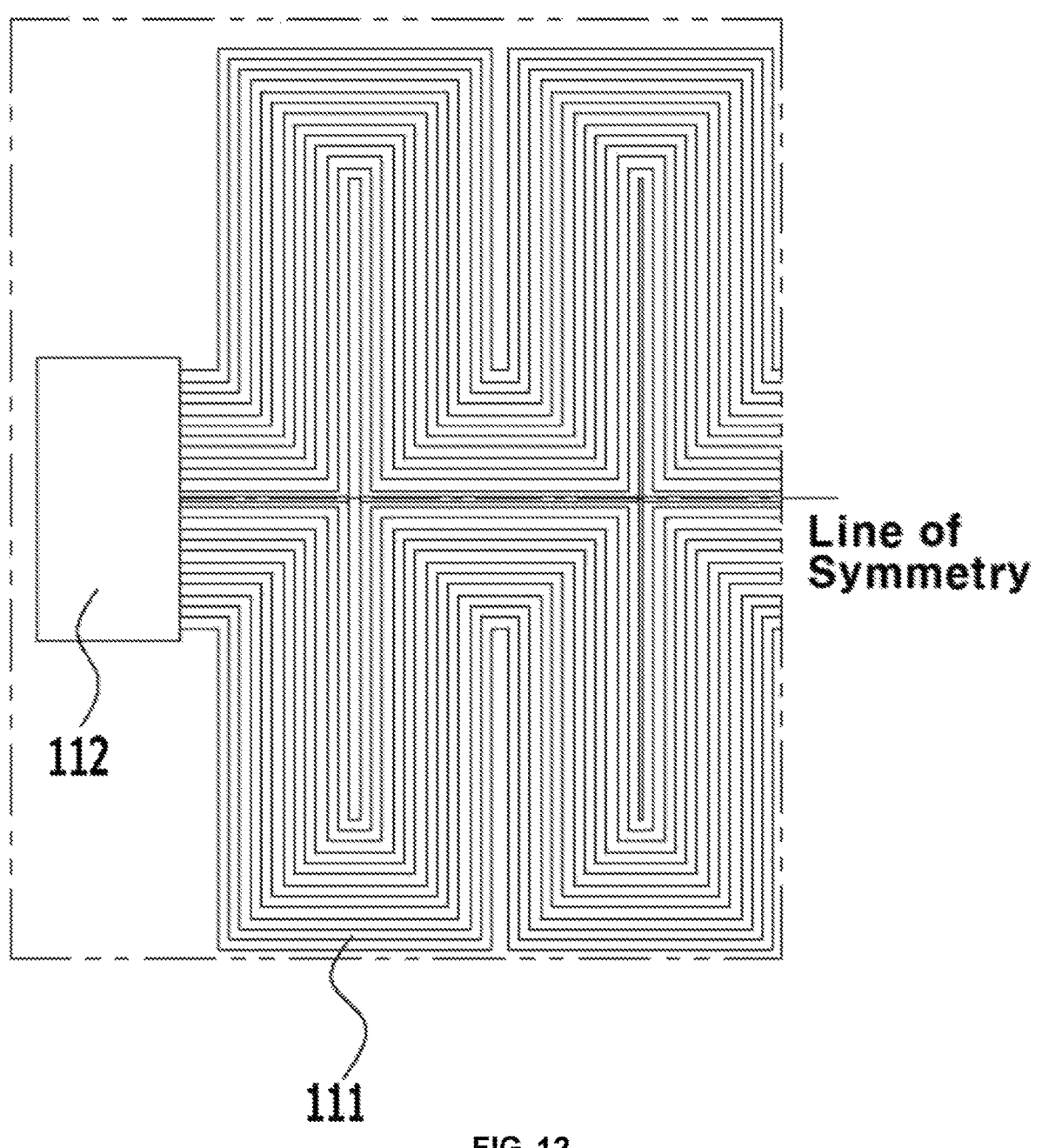
FIG. 12 is an enlarged view of section "A" shown in FIG. 9.
Figure 13:
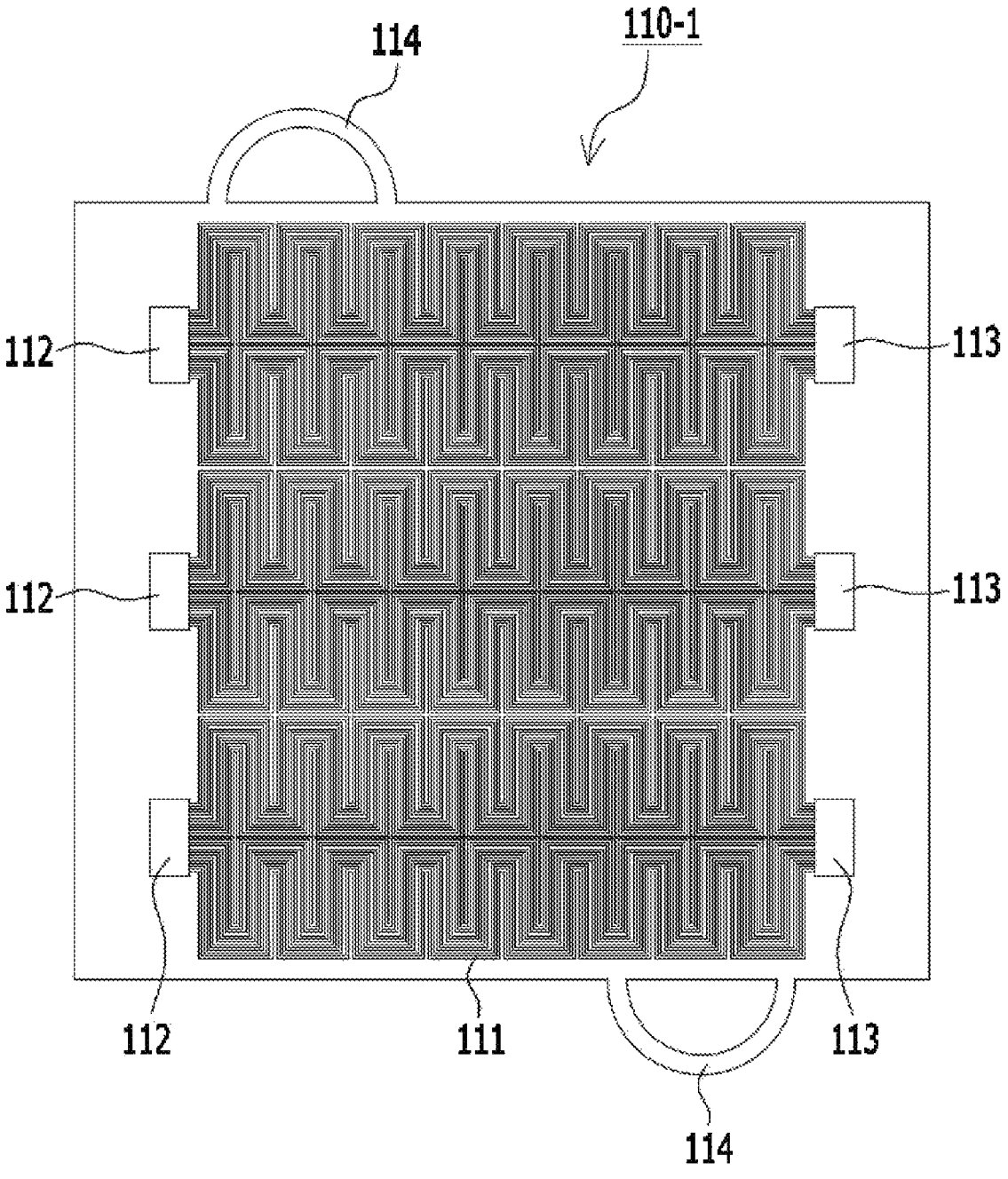
FIG. 13 is a plan view illustrating a first channel plate of the PCHE according to a different embodiment of the system.

In the meantime, as illustrated in FIG. 12, the fluid path ill for fluid A of the first channel plate 110 may have a planar structure in which a plurality of bent passages is arranged. In one embodiment the fluid path 111 for fluid A has a horizontally symmetrical structure, wherein the bent passages contact and adjoin each other.

The structure of the fluid path 111 for fluid A is arranged such that the whole planar area of the first channel plate 110 can be efficiently used. To this end, the planar structure may have a continuous square-wave arrangement.

More specifically, as illustrated in FIG. 12, the fluid path 111 for fluid A may have inflow and outflow parts 112 and 113 for fluid A on opposite end sides thereof, and may have a planar structure in which the fluid path divides into two fluid path branches in a symmetrical form from the inflow part 112 for fluid A.

Figure 14:
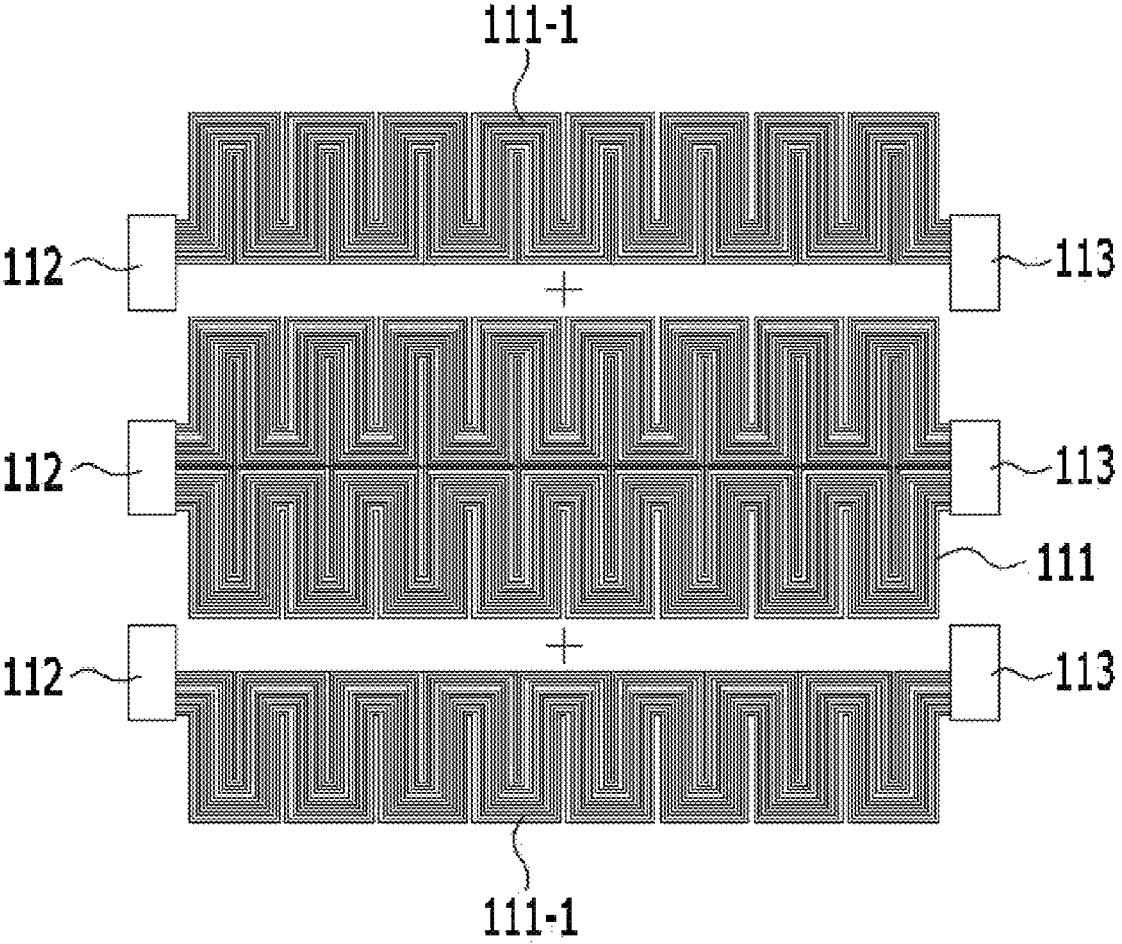
FIG. 14 is a schematic diagram illustrating an arrangement of a fluid path for fluid A in the first channel plate according to a different embodiment of the system.
Figure 15:
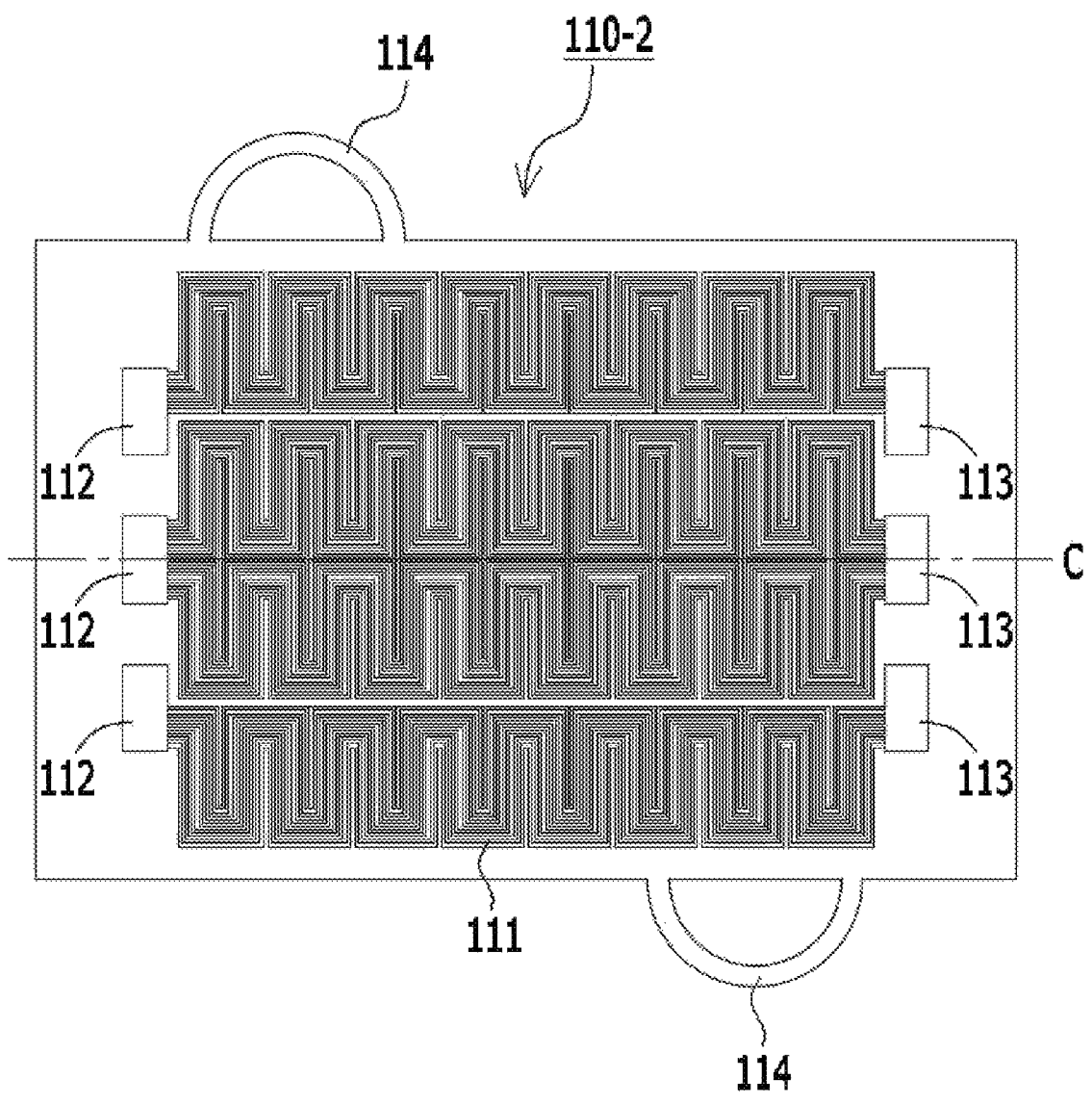
FIG. 15 is a plan view illustrating a first channel plate of the PCHE according to a different embodiment of the system.

If needed, as illustrated in FIGS. 14 and 15, a fluid path structure for fluid A may be arranged so that asymmetrical fluid paths 111-1 are disposed on lateral sides of a symmetrical fluid path 111 for fluid A.

Specifically, as illustrated in FIGS. 14 and 15, the first channel plate 110 may include three adjoining fluid paths 111 and 111-1 for fluid A, having a median fluid path 111 and opposite lateral fluid paths 111-1 in a planar structure in which the opposite lateral fluid paths 111-1 are symmetric with each other about the median fluid path 111 for fluid A.

Here, the median fluid path 111 for fluid A has a planar structure in which the fluid path divides into two fluid path branches in a symmetrical manner from the inflow part 112 for fluid A, and the opposite lateral fluid paths 111-1 for fluid A are symmetric with each other about a median line C of the first channel plate 110.

More specifically, the lateral fluid paths 111-1 for fluid A may extend in one direction from the inflow part 112 for fluid A without divided branches.

In this case, the fluid paths for fluid A having a variety of structures may be properly combined according to installation environments of a heat exchanger, thereby considerably improving the heat exchange efficiency.

While the exemplary embodiments of the system have been described in the detailed description, the system is not limited thereto, but should be construed as including all of modifications, equivalents, and substitutions falling within the spirit and scope of the system defined by the appended claims.

That is, the system is not limited to the above-mentioned embodiments and the description thereof, and it will be appreciated by those skilled in the art that various modifications and equivalent embodiments are possible without departing from the scope and spirit of the system defined by the appended claims and that the system covers all the modifications and equivalents falling within the spirit and the scope of the system as defined by the appended claims.

The invention claimed is:

1. A printed circuit heat exchanger comprising:
a stack of channel plates including
a plurality of first channel plates and a plurality of second channel plates, the first and second channel plates having a rectangular planar structure, the rectangular planar structure having two pairs of sides along a first direction and a second direction, the first direction and the second direction being perpendicular to each other,
wherein the first channel plates and the second channel plates are alternately stacked on one another, such that fluids A and B are heat-exchanged between the first and second channel plates,
the first channel plate having a fluid path in first pattern for fluid A extending in two divided branches on one surface thereof,
wherein inflow and outflow parts for fluid A are formed on first and second opposite end sides, in the first direction, of the fluid path for fluid A, the inflow and outflow parts for fluid A being formed within the rectangular planar structure of the first channel plate,
wherein the fluid path in the first pattern for fluid A extends from the inflow part for fluid A to the outflow part for fluid A by bending in a first serpentine shape between the inflow part and the outflow part for fluid A, such that multiple portions of the fluid path in the first pattern for fluid A extends in the first direction and other multiple portions of the fluid path in the first pattern for fluid A extends in the second direction,
the second channel plate having a fluid path in a second pattern, wherein the first pattern is different from the second pattern for fluid B intersecting with the fluid path for fluid A on one surface thereof,
wherein inflow and outflow parts for fluid B are integrally formed on third and fourth opposite end sides, in the second direction, of the fluid path for fluid B, the second direction being perpendicular to the first direction,
wherein the fluid path in the second pattern for fluid B extends from the inflow part for fluid B to the outflow part for fluid B by bending in a second serpentine shape between the inflow part and the outflow part for fluid B, such that at least one portion of the fluid path in the second pattern for fluid B extends in the first direction and at least one other portion of the fluid path in the second pattern for fluid B extends in the second direction,
wherein the first channel plate has communicating structures corresponding to the inflow and outflow parts for fluid B on opposite sides thereof;
an upper plate section attached to an upper surface of the stack to close the upper surface of the stack;
a lower plate section attached to an undersurface of the stack to close the undersurface of the stack;
the stack of channel plates having an integrated conventional inflow header formed thereon;
the upper plate section providing a top cover of the integrated conventional inflow header and the lower plate section providing a bottom cover of the integrated conventional inflow header and
wherein the fluid path for fluid A has a planar structure in which the fluid path divides into two divided branches in a symmetrical form from the inflow part for fluid A,
wherein the first channel plate comprises at least three pairs of inflow and outflow parts for fluid A, which include a first, second, and third pairs, and at least three fluid paths for fluid A corresponding to the at least three pairs of inflow and outflow parts for fluid A, the at least three fluid paths for fluid A including a first, second, and third fluid paths for fluid A corresponding to the first, second, and third pairs of inflow and outflow parts for fluid A, respectively,
wherein each of the first, second, and third fluid paths for fluid A exclusively and only communicates between corresponding one pair of the first, second, and third pairs of inflow and outflow parts for fluid A, such that
the first fluid path for fluid A communicates exclusively and only between the first pair of inflow and outflow parts for fluid A,
the second fluid path for fluid A communicates exclusively and only between the second pair of inflow and outflow parts for fluid A, and
the third fluid path for fluid A communicates exclusively and only between the third pair of inflow and outflow parts for fluid A,
wherein the second fluid path for fluid A is positioned between the first fluid path for fluid A and the third fluid path for fluid A, and the first fluid path for fluid A and the third fluid path for fluid A are serpentinely bent in a symmetric manner to each other relative to the second fluid path for fluid A.

2. The printed circuit heat exchanger according to claim 1, wherein the fluid path for fluid A has a planar structure in which a plurality of bent passages adjoins each other.

3. The printed circuit heat exchanger according to claim 1, wherein the inflow and outflow parts for fluid B formed on the second channel plate have a semicircular or polygonal shape attached to opposite sides of the rectangular planar structure, with an internal space thereof communicating with the fluid path for fluid B.

4. The printed circuit heat exchanger according to claim 3, wherein the inflow and outflow parts for fluid B are integrated with the second channel plate.

5. The printed circuit heat exchanger according to claim 3, wherein the inflow and outflow parts for fluid B and the communicating structures of the first channel plate are stacked on one another to form a single communicating space.

6. The printed circuit heat exchanger according to claim 5, wherein the single communicating space has a semi-cylindrical or polyprism structure.

7. The printed circuit heat exchanger according to claim 5, wherein the stack is provided, on one side thereof, with additional fluid holes communicating with the inflow and outflow parts for fluid B.

8. The printed circuit heat exchanger according to claim 7, wherein inflow and outflow pipes for fluid B are connected to the additional fluid holes.

9. The printed circuit heat exchanger according to claim 1, wherein the inflow and outflow parts for fluid A formed on the first channel plate have a semicircular or polygonal shape attached to inner surfaces of the rectangular planar structure, with an internal space thereof communicating with the fluid path for fluid A.

10. The printed circuit heat exchanger according to claim 9, wherein the second channel plate is provided with communicating structures corresponding to the inflow and outflow parts for fluid A.

11. The printed circuit heat exchanger according to claim 10, wherein the inflow and outflow parts for fluid A and the communicating structures of the second channel plate are stacked on one another to form a single communicating space.

12. The printed circuit heat exchanger according to claim 11, wherein the single communicating space has a semi-cylindrical or polyprism structure.

13. The printed circuit heat exchanger according to claim 1, wherein the second channel plate is provided with communicating structures corresponding to the at least three pairs of inflow and outflow parts for fluid A, the communicating structures being formed within the rectangular planar structure of the second channel plate at positions corresponding to the at least three pairs of inflow and outflow parts for fluid A in the first channel plate.

* * * * *